United States Patent
Chan et al.

(10) Patent No.: US 9,449,718 B2
(45) Date of Patent: Sep. 20, 2016

(54) METHOD FOR SETTING A FLASH MEMORY FOR HTOL TESTING

(71) Applicants: Semiconductor Manufacturing International (Beijing) Corporation, Beijing (CN); Semiconductor Manufacturing International (Shanghai) Corporation, Shanghai (CN)

(72) Inventors: Yipeng Chan, Shanghai (CN); Kijun Kim, Shanghai (CN); Guoxu Zhao, Shanghai (CN); Xiao Ye, Shanghai (CN); Zhen Yang, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 32 days.

(21) Appl. No.: 14/566,060

(22) Filed: Dec. 10, 2014

(65) Prior Publication Data
US 2015/0325307 A1   Nov. 12, 2015

(30) Foreign Application Priority Data
May 9, 2014   (CN) .......................... 2014 1 0195902

(51) Int. Cl.
*G11C 29/50* (2006.01)
*G11C 16/30* (2006.01)
*G11C 29/06* (2006.01)
*G11C 29/44* (2006.01)
*G11C 16/00* (2006.01)

(52) U.S. Cl.
CPC ......... *G11C 29/50004* (2013.01); *G11C 16/30* (2013.01); *G11C 29/06* (2013.01); *G11C 29/44* (2013.01); *G11C 16/00* (2013.01)

(58) Field of Classification Search
CPC . G11C 16/30; G11C 29/50004; G11C 29/06; G11C 29/44; G11C 16/00
See application file for complete search history.

(56) References Cited

U.S. PATENT DOCUMENTS

| 7,254,692 | B1* | 8/2007 | Teoh | G11C 29/50 365/230.03 |
|---|---|---|---|---|
| 7,405,972 | B1* | 7/2008 | Lin | G11C 16/3418 257/E21.679 |
| 2003/0185051 | A1* | 10/2003 | Yeh | G11C 16/12 365/185.16 |
| 2007/0141731 | A1* | 6/2007 | Hemink | G11C 16/0483 438/14 |
| 2011/0216596 | A1* | 9/2011 | Choi | H01L 29/788 365/185.18 |

* cited by examiner

*Primary Examiner* — Richard Elms
*Assistant Examiner* — Ajay Ojha
(74) *Attorney, Agent, or Firm* — Innovation Counsel LLP

(57) ABSTRACT

A method for setting voltages in a flash memory for high temperature operating life (HTOL) testing is provided. The flash memory includes a substrate, a source, and a control gate. The method includes adjusting the voltages that are applied to the source, the control gate, and the substrate, such that there is no voltage difference between the control gate and the source, and no voltage difference between the control gate and the substrate. Specifically, adjusting the voltages includes setting the voltage that is applied to the source to a ground voltage, setting the voltage that is applied to the control gate to the ground voltage, and setting the voltage that is applied to the substrate to a power supply voltage.

9 Claims, 3 Drawing Sheets

METHOD FOR SETTING A FLASH MEMORY FOR HTOL TESTING

CROSS-REFERENCE TO RELATED APPLICATION

This application claims priority to Chinese Patent Application No. 201410195902.5 filed on May 9, 2014, the disclosure of which is incorporated herein by reference in its entirety.

BACKGROUND

1. Technical Field

The present disclosure relates to the field of semiconductor technology, and more particularly to a method for setting a flash memory for high temperature operating life (HTOL) testing.

2. Description of the Related Art

In the field of semiconductor technology, high temperature operating life (HTOL) tests are used to assess the reliability of a device under high temperature and high voltage conditions over an extended period of time. For example, the reliability of a flash memory can be determined by running a HTOL test after the flash memory has undergone hundreds (or thousands) of rounds of cycling. Typically, a 1000-hour HTOL test is performed on flash memory products after they have undergone 10000 rounds of cycling.

However, in some instances, the HTOL test can be affected by voltage differences between various components in the flash memory.

SUMMARY

The present disclosure addresses at least the above issues, by disclosing a method for eliminating the voltage differences between the various components in the flash memory during the HTOL test.

According to an embodiment of the inventive concept, a method for setting voltages in a flash memory for high temperature operating life (HTOL) testing is provided. The flash memory includes a substrate, a source, and a control gate. The method includes adjusting the voltages that are applied to the source, the control gate, and the substrate, such that there is no voltage difference between the control gate and the source, and no voltage difference between the control gate and the substrate. Adjusting the voltages further includes setting the voltage that is applied to the source to a ground voltage, setting the voltage that is applied to the control gate to the ground voltage, and setting the voltage that is applied to the substrate to a power supply voltage.

In one embodiment, the flash memory may further include a select gate, and the method may further include setting a voltage that is applied to the select gate to the power supply voltage.

In one embodiment, the flash memory may further include a drain, and the method may further include setting a voltage that is applied to the drain to an operating voltage.

In one embodiment, the power supply voltage may be set to 1.8V.

In one embodiment, the operating voltage may be set to 1.8V.

In one embodiment, the ground voltage may be set to 0V.

In one embodiment, the flash memory may be configured to be in a standby mode.

In one embodiment, the substrate may be doped with an n-type dopant, and the source and the drain may be doped with a p-type dopant.

In one embodiment, the flash memory may be a NOR flash memory.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
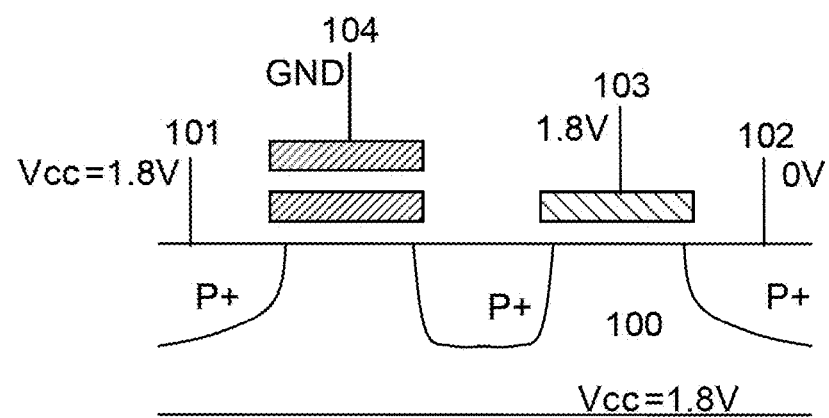
FIG. 1 is a schematic diagram of a method for setting a flash memory for HTOL testing.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

FIG. 1 is a schematic diagram of a method for setting a flash memory for HTOL testing. The term "setting" as used herein refers to the setting of the applied voltages in the flash memory.

The flash memory may be a NOR flash memory. Referring to FIG. 1, a unit cell of the NOR flash memory includes a substrate 100, a source 101, a drain 102, a select gate 103, and a control gate 104. The select gate 103 is configured to select a corresponding cell during operation of the flash memory. The control gate 104 determines whether a charge defined state of "0" or "1" is stored. When a charge is stored in the control gate 104, the corresponding cell will be in an "ON" state and a "0" state is stored. Conversely, when a charge is not stored in the control gate 104, the corresponding cell will be in an "OFF" state and a "1" state is stored.

Referring to FIG. 1, the flash memory cell is in a standby mode and the voltage of the select gate 103 may be 1.8V. It is noted that when the flash memory cell is selected to be in a read state, the voltage of the select gate 103 may be −1.2V.

To obtain high speeds, the flash memory is set to be in a constant standby mode. Specifically, the substrate 100 is connected to a power supply voltage Vcc (e.g. 1.8V); the control gate 104 and the drain 102 are connected to ground (GND); and the source 101 is connected to the power supply voltage Vcc (e.g. 1.8V). As a result, a voltage difference may exist between the control gate 104 and the substrate 100, and between the control gate 104 and the source 101. The voltage difference can accelerate leakage of charge stored in the control gate 104, especially after the flash memory cell has undergone hundreds (or thousands) of rounds of cycling.

During the HTOL test, the amount of charge stored in the control gate 104 has to be maintained at a certain level to ensure accuracy in the test results. However, as described above, the voltage difference between the control gate 104 and the substrate 100/source 101 can accelerate charge leakage from the control gate, which may then impact the accuracy of the HTOL test results.

Next, a method for setting a flash memory for HTOL testing according to an embodiment will be described with reference to the schematic diagram in FIG. 2. Specifically, the method includes adjusting the voltages applied to the various electrodes of the flash memory when the flash memory is in a standby mode, so as to increase the charge storage capability of the control gate and ensure accuracy in the HTOL test results.

Figure 2:
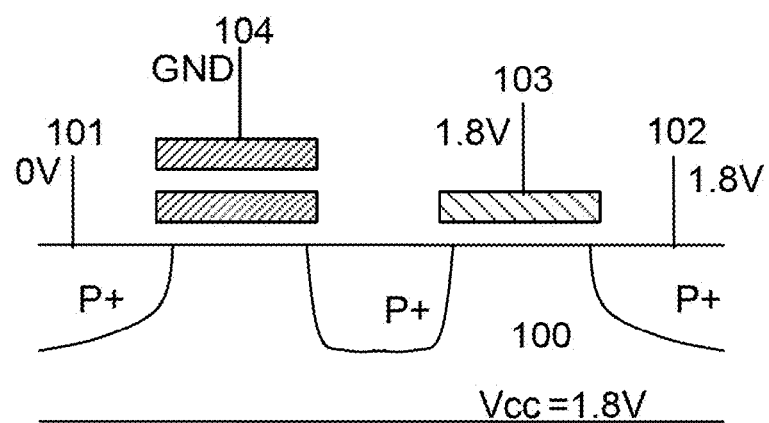
FIG. 2 is a schematic diagram of a method for setting a flash memory for HTOL testing according to an embodiment.

The flash memory in the embodiment of FIG. 2 may be similar to the flash memory in FIG. 1. For example, the flash memory in FIG. 2 may be a NOR flash memory. The flash memory may include a plurality of cells. Each cell may include a substrate 100, a source 101, a drain 102, a select gate 103, and a control gate 104.

The select gate 103 is configured to select a corresponding cell during operation. The control gate 104 is configured to determine whether a charge defined state of "0" or "1" is stored. If a charge is stored in the control gate 104, the corresponding cell will be in an "ON" state and a "0" state is stored. Conversely, if a charge is not stored in the control gate 104, the corresponding cell will be in an "OFF" state and a "1" state is stored. In the interest of clarity, only one cell of the flash memory is illustrated in FIG. 2. As shown in FIG. 2, the cell includes a pair of transistors. The transistors may be, for example, p-type metal-oxide-semiconductor (PMOS). In other words, the source and the drain may be doped with a p-type dopant.

The embodiment in FIG. 2 differs from the setup in FIG. 1 as follows. In the embodiment of FIG. 2, different voltages are applied to the various electrodes of the flash memory during HTOL testing. Specifically, the voltage applied to the source 101 is set to GND (e.g. 0V), and the voltage applied to the drain 102 is set to an operating voltage Vcc (e.g. 1.8V). In addition, the substrate 100 (comprising a bulk N-well) is connected to a power supply voltage Vcc (e.g. 1.8V), the control gate 104 is connected to GND, and the voltage applied to the select gate 103 is set to the power supply voltage Vcc (e.g. 1.8V). Since the voltage applied to the select gate 103 is set to the power supply voltage Vcc (e.g. 1.8V), the flash memory is thus in a standby mode.

It is noted that the embodiment of FIG. 2 may be obtained by interchanging/switching the voltages applied to the source and drain in the setup of FIG. 1.

Using the setup and method in FIG. 2 can ensure there is no voltage difference between the control gate 104 and the source 101, and between the control gate 104 and the substrate 100. Specifically, when the voltage applied to the substrate 100 is set to Vcc and the voltage applied to the control gate 104 is set to GND, the PMOS will be in an "ON" state. Since the voltage applied to the source 101 is GND, the channel will be in the GND state, thus eliminating the voltage difference between the control gate 104 and the substrate 100. Accordingly, there will be no voltage difference between the control gate 104 and the source 101, and between the control gate 104 and the substrate 100. Therefore, the strength of the electric field between the control gate 104 and source 101/substrate 100 in the embodiment of FIG. 2 will be significantly reduced compared to the setup of FIG. 1. As a result, the charge stored in the control gate 104 in the embodiment of FIG. 2 is less likely to leak (i.e. lower charge leakage compared to the setup of FIG. 1).

It should be noted that other appropriate voltage values may be applied to the source, control gate, and substrate, so as to eliminate the voltage difference between the control gate and the source, and between the control gate and the substrate.

In the present embodiment, by interchanging/switching the voltages applied to the source and drain in the setup of FIG. 1, the voltage difference between the control gate and the source/substrate can be eliminated, thereby improving the charge storage capability of the control gate.

Figure 3A:
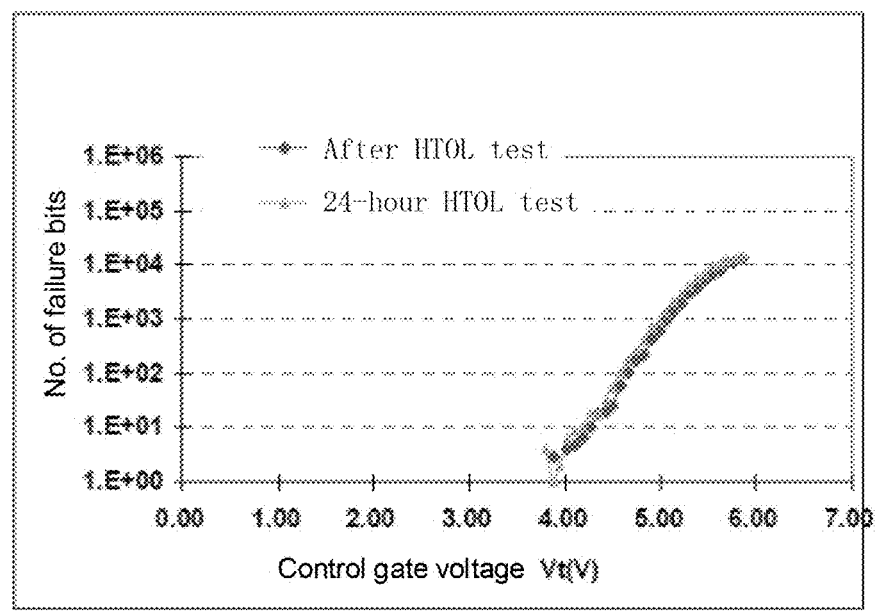
FIG. 3A is a graph of the simulation results for the embodiment of FIG. 2.
Figure 3B:
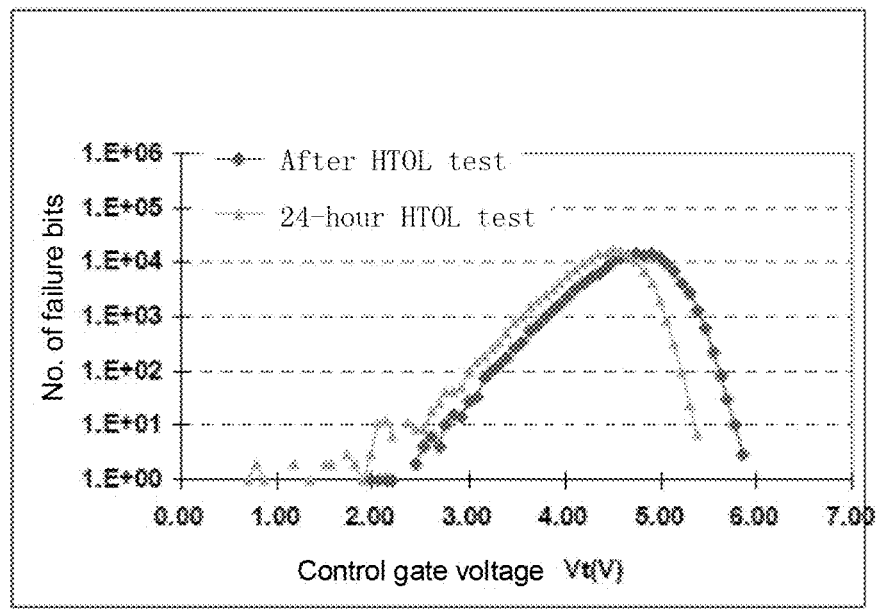
FIG. 3B is a graph of the simulation results for the setup of FIG. 1.

The improvement in the charge storage capability of the control gate in the exemplary embodiment of FIG. 2 over the setup of FIG. 1 can be observed by comparing FIG. 3A with FIG. 3B. Specifically, FIG. 3A is a graph of the simulation results for the embodiment of FIG. 2, and FIG. 3B is a graph of the simulation results for the setup of FIG. 1.

Referring to FIG. 3A, no shift/offset in the voltage applied to the control gate ("control gate voltage") is observed after the HTOL testing. In contrast, referring to FIG. 3B, the plot of the control gate voltage versus number of failure bits shows a "tail" after the HTOL testing. In other words, there is a significant shift/offset in the control gate voltage using the setup/method of FIG. 1. Accordingly, the charge storage capability of the control gate is improved in the embodiment of FIG. 2 (compared to the setup of FIG. 1), thus ensuring accuracy in the HTOL test results.

In the exemplary method for setting a flash memory for HTOL testing, the voltages applied to the source, control gate, and substrate are adjusted so as to eliminate the voltage difference between the control gate and the source, and between the control gate and the substrate. Accordingly, the charge storage capability of the control gate is improved, thereby ensuring accuracy in the HTOL test results.

A method for setting a flash memory for HTOL testing according to an embodiment has been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method for setting voltages in a flash memory for high temperature operating life (HTOL) testing, the flash memory comprising a substrate including a source region and a drain region, and a control gate, the method comprising:

setting the voltages that are applied to the source region, the control gate, and the substrate when the flash memory is in a standby mode, where setting the voltages further comprises:

setting a first voltage that is applied to the source region to a ground voltage, setting a second voltage that is applied to the control gate to the ground voltage, and setting a third voltage that is applied to the substrate to a power supply voltage that is higher than the ground voltage, wherein a charge leakage between the control gate and the substrate is reduced and a charge storage capability of the control gate is improved by applying the ground voltage to both the control gate and the source region when the flash memory is in the standby mode.

2. The method according to claim 1, wherein the flash memory further includes a select gate, the method further comprising:

setting a fourth voltage that is applied to the select gate to the power supply voltage.

3. The method according to claim 1, further comprising:

setting a fifth voltage that is applied to the drain region to an operating voltage.

4. The method according to claim 2, wherein the power supply voltage is set to 1.8V.

5. The method according to claim 3, wherein the operating voltage is set to 1.8V.

6. The method according to claim 1, wherein the ground voltage is set to 0V.

7. The method according to claim 1, wherein the flash memory includes a p-type metal-oxide-semiconductor (PMOS) transistor.

8. The method according to claim 3, wherein the substrate is doped with an n-type dopant, and the source region and the drain region are doped with a p-type dopant.

9. The method according to claim 1, wherein the flash memory is a NOR flash memory.

* * * * *